(12) United States Patent
Endo et al.

(10) Patent No.: US 8,853,684 B2
(45) Date of Patent: Oct. 7, 2014

(54) SEMICONDUCTOR DEVICE

(75) Inventors: Yuta Endo, Atsugi (JP); Toshinari Sasaki, Atsugi (JP); Kosei Noda, Atsugi (JP); Mizuho Sato, Kawasaki (JP); Mitsuhiro Ichijo, Zama (JP); Toshiya Endo, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 129 days.

(21) Appl. No.: 13/109,594

(22) Filed: May 17, 2011

(65) Prior Publication Data

US 2011/0284854 A1   Nov. 24, 2011

(30) Foreign Application Priority Data

May 21, 2010   (JP) ................. 2010-117086

(51) Int. Cl.
*H01L 29/04*   (2006.01)
*H01L 29/786*   (2006.01)
*H01L 29/49*   (2006.01)

(52) U.S. Cl.
CPC ...... *H01L 29/7869* (2013.01); *H01L 29/78603* (2013.01); *H01L 29/78606* (2013.01); *H01L 29/4908* (2013.01)
USPC .................. 257/43; 257/40; 257/E29.296

(58) Field of Classification Search
CPC ............ H01L 27/1214; H01L 29/4908; H01L 29/7869; H01L 29/78606; H01L 29/78603; H01L 29/786
USPC .......... 257/59, 79, E29.296, 40, 43, E21.412, 257/E29.273, E21.212, E33.053; 438/104, 438/161
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

CN   1870233   11/2006
CN   101290876   10/2008
(Continued)

OTHER PUBLICATIONS

International Search Report (Application No. PCT/JP2011/060792) Dated Jun. 21, 2011.

(Continued)

*Primary Examiner* — Cuong Q Nguyen
*Assistant Examiner* — Yosef Gebreyesus
(74) *Attorney, Agent, or Firm* — Eric J. Robinson; Robinson Intellectual Property Law Office, P.C.

(57) ABSTRACT

In a transistor having a top-gate structure in which a gate electrode layer overlaps with an oxide semiconductor layer which forms a channel region with a gate insulating layer interposed therebetween, when a large amount of hydrogen is contained in the insulating layer, hydrogen is diffused into the oxide semiconductor layer because the insulating layer is in contact with the oxide semiconductor layer; thus, electric characteristics of the transistor are degraded. An object is to provide a semiconductor device having favorable electric characteristics. An insulating layer in which the concentration of hydrogen is less than $6\times10^{20}$ atoms/cm$^3$ is used for the insulating layer being in contact with oxide semiconductor layer which forms the channel region. Using the insulating layer, diffusion of hydrogen can be prevented and a semiconductor device having favorable electric characteristics can be provided.

23 Claims, 9 Drawing Sheets

(56) References Cited

U.S. PATENT DOCUMENTS

| | | |
|---|---|---|
| 6,294,274 B1 | 9/2001 | Kawazoe et al. |
| 6,448,577 B1 * | 9/2002 | Yamazaki et al. ............... 257/59 |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,307,279 B2 * | 12/2007 | Yamazaki et al. ............... 257/40 |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 * | 11/2008 | Iwasaki ........................... 257/59 |
| 7,462,862 B2 | 12/2008 | Hoffman et al. |
| 7,465,677 B2 | 12/2008 | Isobe et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,642,114 B2 | 1/2010 | Yamaguchi et al. |
| 7,674,650 B2 | 3/2010 | Akimoto et al. |
| 7,718,547 B2 | 5/2010 | Isobe et al. |
| 7,732,819 B2 | 6/2010 | Akimoto et al. |
| 7,791,072 B2 | 9/2010 | Kumomi et al. |
| 7,897,476 B2 | 3/2011 | Yamazaki et al. |
| 7,955,995 B2 * | 6/2011 | Kakehata et al. ............ 438/795 |
| 2001/0046027 A1 | 11/2001 | Tai et al. |
| 2002/0039814 A1 * | 4/2002 | Jada et al. ...................... 438/155 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118166 A1 | 6/2006 | Iwaki |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0246738 A1 | 11/2006 | Isobe et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0261376 A1 | 10/2008 | Yamazaki et al. |
| 2008/0290393 A1 * | 11/2008 | Kakehata et al. ............. 257/316 |
| 2008/0296567 A1 * | 12/2008 | Irving et al. ................... 257/43 |
| 2008/0296568 A1 | 12/2008 | Ryu et al. |
| 2009/0065771 A1 * | 3/2009 | Iwasaki et al. ................. 257/43 |
| 2009/0068773 A1 | 3/2009 | Lai et al. |
| 2009/0073325 A1 | 3/2009 | Kuwabara et al. |
| 2009/0098720 A1 | 4/2009 | Isobe et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0038639 A1 | 2/2010 | Akimoto |
| 2010/0045179 A1 | 2/2010 | Sano et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0233847 A1 | 9/2010 | Ohara et al. |
| 2010/0283049 A1 * | 11/2010 | Sato et al. ...................... 257/43 |
| 2011/0053322 A1 | 3/2011 | Sasaki et al. |
| 2011/0068336 A1 | 3/2011 | Yamazaki et al. |
| 2011/0089416 A1 | 4/2011 | Yamazaki et al. |
| 2011/0136320 A1 | 6/2011 | Yamazaki et al. |
| 2011/0309355 A1 | 12/2011 | Ichijo et al. |

FOREIGN PATENT DOCUMENTS

| | | |
|---|---|---|
| CN | 101464892 | 6/2009 |
| CN | 101548383 | 9/2009 |
| CN | 101884109 | 11/2010 |
| EP | 1717847 A | 11/2006 |
| EP | 1737044 A | 12/2006 |
| EP | 1983566 A | 10/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-075987 | 3/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2005-285975 A | 10/2005 |
| JP | 2006-165527 | 6/2006 |
| JP | 2006-165528 | 6/2006 |
| JP | 2006-165529 | 6/2006 |
| JP | 2006-332634 A | 12/2006 |
| JP | 2007-096055 | 4/2007 |
| JP | 2007-123861 | 5/2007 |
| JP | 2008-004929 A | 1/2008 |
| JP | 2008-141119 A | 6/2008 |
| JP | 2008-288563 A | 11/2008 |
| JP | 2009-141002 A | 6/2009 |
| JP | 2009-224479 A | 10/2009 |
| KR | 2006-0113485 A | 11/2006 |
| KR | 2008-0094558 A | 10/2008 |
| KR | 2009-0029738 A | 3/2009 |
| KR | 2009-0095612 A | 9/2009 |
| WO | WO-2004/114391 | 12/2004 |
| WO | WO-2007/138937 | 12/2007 |
| WO | WO-2008/069286 | 6/2008 |
| WO | WO-2009/072532 | 6/2009 |

OTHER PUBLICATIONS

Written Opinion (Application No. PCT/JP2011/060792) Dated Jun. 21, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amporphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Display,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

(56) References Cited

OTHER PUBLICATIONS

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-45501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR DEVICE

TECHNICAL FIELD

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and an electronic device are all semiconductor devices.

BACKGROUND ART

In recent years, transistors which are used for many liquid crystal display devices and light-emitting display devices typified by flat panel displays have included a silicon semiconductor such as amorphous silicon or polycrystalline silicon and have been formed over glass substrates.

Instead of the silicon semiconductor, a technique in which an oxide semiconductor is used for transistors has attracted attention.

For example, techniques by which a transistor is manufactured using zinc oxide which is a single-component metal oxide or an In—Ga—Zn—O-based oxide which is a homologous compound as an oxide semiconductor, and is used as a switching element or the like of a pixel of a display device, is disclosed (see Patent Document 1 to Patent Document 3).

REFERENCE

Patent Documents

[Patent Document 1] Japanese Published Patent Application No. 2006-165528
[Patent Document 2] Japanese Published Patent Application No. 2007-96055
[Patent Document 3] Japanese Published Patent Application No. 2007-123861

DISCLOSURE OF INVENTION

There is a problem in that drain current flows even in the state (Vg=0V) where voltage is not applied to a gate electrode in a transistor whose channel region includes an oxide semiconductor because a threshold voltage (Vth) shifts in the negative direction.

In view of the above problems, an object of an embodiment of the present invention disclosed in this specification is to provide a semiconductor device with favorable electric characteristics.

In order to achieve the object, an insulating layer with a low hydrogen content is used as an insulating layer being in contact with an oxide semiconductor layer which forms a channel region, whereby diffusion of hydrogen into the oxide semiconductor layer can be prevented. Specifically, an insulating layer in which the concentration of hydrogen is less than $6\times10^{20}$ atoms/cm$^3$, preferably less than or equal to $5\times10^{20}$ atoms/cm$^3$, more preferably less than or equal to $5\times10^{19}$ atoms/cm$^3$ is used as the insulating layer being in contact with the oxide semiconductor layer.

An embodiment of the present invention is a semiconductor device which comprises a gate electrode layer, an oxide semiconductor layer which forms a channel region, a source electrode layer and a drain electrode layer being in contact with the oxide semiconductor layer, a gate insulating layer provided between the gate electrode layer and the oxide semiconductor layer, and an insulating layer which faces the gate insulating layer with the oxide semiconductor layer interposed therebetween and is in contact with the oxide semiconductor layer, in which the concentration of hydrogen is less than $6\times10^{20}$ atoms/cm$^3$, preferably less than or equal to $5\times10^{20}$ atoms/cm$^3$, more preferably less than or equal to $5\times10^{19}$ atoms/cm$^3$.

A transistor having a top-gate structure, in which a gate electrode layer overlaps with an oxide semiconductor layer with a gate insulating layer interposed therebetween has a top-contact type and a bottom-contact type. The top-contact transistor includes an oxide semiconductor layer between source and drain electrode layers and the insulating layer, and the bottom-contact transistor includes source and drain electrode layers between the oxide semiconductor layer and the insulating layer.

Another embodiment of the present invention is a semiconductor device including a top-gate/top-contact transistor and a top-gate/bottom contact transistor in which the concentration of hydrogen in an insulating layer being in contact with an oxide semiconductor layer is less than $6\times10^{20}$ atoms/cm$^3$, preferably less than or equal to $5\times10^{20}$ atoms/cm$^3$, more preferably less than or equal to $5\times10^{19}$ atoms/cm$^3$.

Further, in another embodiment of the present invention, an oxide insulating layer comprising silicon oxide, silicon oxynitride, silicon nitride oxide, hafnium oxide, aluminum oxide, or tantalum oxide can be used as the insulating layer.

Further, a gate insulating layer with a low hydrogen content is used as the gate insulating layer provided for the top-gate/top-contact transistor and the top-gate/bottom contact transistor, whereby a semiconductor device having favorable electric characteristics can be obtained.

Another embodiment of the present invention is a semiconductor device in which the concentration of hydrogen in the gate insulating layer being in contact with the oxide semiconductor layer is less than $6\times10^{20}$ atoms/cm$^3$, preferably less than or equal to $5\times10^{20}$ atoms/cm$^3$, more preferably less than or equal to $5\times10^{19}$ atoms/cm$^3$.

According to one embodiment of the present invention, a semiconductor device having favorable electric characteristics can be provided.

BEST MODE FOR CARRYING OUT THE INVENTION

Figure 1A:
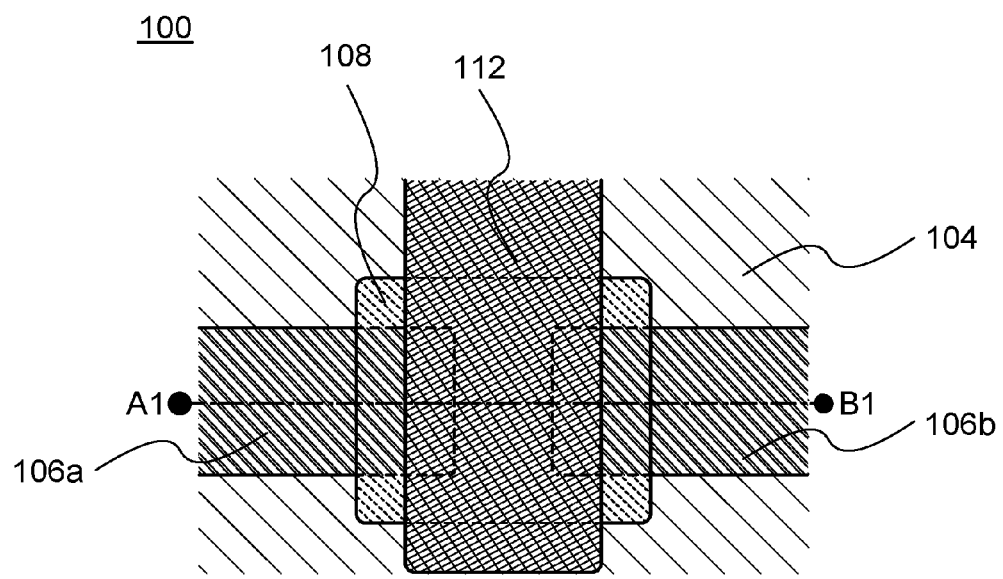
FIGS. 1A and 1B illustrate a top view and a cross-sectional view of a transistor, respectively.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. In addition, an insulating layer is not illustrated in a top view in some cases. Note that the size, the layer thickness, or the region of each structure illustrated in each drawing is exaggerated for clarity in some cases. Therefore, the present invention is not necessarily limited to such scales illustrated in the drawings.

Note that when it is described that "A and B are connected to each other", the case where A and B are electrically connected to each other, and the case where A and B are directly connected to each other are included therein. Here, each of A and B corresponds to an object (e.g., a device, an element, a circuit, a wiring, an electrode, a terminal, a conductive film, or a layer).

Note that, functions of "source" and "drain" may become switched in the case that a direction of a current flow is changed during circuit operation, for example. Therefore, the terms "source" and "drain" can be used to denote the drain and the source, respectively, in this specification.

Embodiment 1

In this embodiment, a semiconductor device which is one embodiment of the present invention is described with reference to FIGS. 1A and 1B.

FIG. 1A is a top view of a transistor 100 included in a semiconductor device. FIG. 1B is a cross sectional view along line A1-B1 of FIG. 1A. The transistor 100 includes, over a substrate 102, an insulating layer 104, a source electrode layer 106a and a drain electrode layer 106b, an oxide semiconductor layer 108 including a channel region, a gate insulating layer 110, and a gate electrode layer 112.

The transistor 100 is a transistor having a top-gate structure, in which a gate electrode layer 112 is formed so as to overlap with the oxide semiconductor layer 108 with the gate insulating layer 110 interposed therebetween. Further, the transistor 100 is a bottom-contact transistor in which the source electrode layer 106a and the drain electrode layer 106b are provided between the oxide semiconductor layer 108 and the insulating layer 104.

The transistor 100 is a top-gate/bottom-contact transistor, so that part of the upper surface of the insulating layer 104 and part of the lower surface of the oxide semiconductor layer 108 are in contact with each other. Therefore, in manufacturing steps of the transistor 100, hydrogen is diffused into the oxide semiconductor layer 108 when a large amount of hydrogen exists in the insulating layer 104. Hydrogen is diffused into the oxide semiconductor layer 108, so that excessive carriers are generated in the oxide semiconductor layer 108. Thus, the threshold voltage (Vth) of the transistor 100 shifts in the negative direction, and drain current flows even in the state (Vg=0V) where voltage is not applied to the gate electrode (normally-on). Therefore, when a large amount of hydrogen exists in the insulating layer 104, electric characteristics of the transistor 100 are degraded.

There is a method in which the oxide semiconductor layer 108 is subjected to heat treatment in order to remove the diffused hydrogen from the oxide semiconductor layer 108. However, as the manufacturing steps of the transistor are increased, manufacturing cost is increased and yield may be reduced.

Thus, an insulating layer in which the concentration of hydrogen is less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$ is used as the insulating layer 104 being in contact with the oxide semiconductor layer 108, whereby diffusion of hydrogen in the oxide semiconductor layer 108 can be prevented and a transistor having favorable electric characteristics can be provided. Accordingly, a transistor having favorable electric characteristics can be provided without increasing the number of manufacturing steps of the transistor.

Further, the concentration of hydrogen in the gate insulating layer 110 can be less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$. In other words, the concentration of hydrogen in each of the insulating layer 104 and the gate insulating layer 110 is less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$, whereby diffusion of hydrogen in the oxide semiconductor layer 108 can be suppressed.

There is no particular limitation on the substrate 102 as long as it has a resistance for the manufacturing steps performed later. For example, an insulating substrate such as a glass substrate, a ceramic substrate, a quartz substrate, or a sapphire substrate; a semiconductor substrate which is formed using a semiconductor material such as silicon; a conductive substrate which is formed using a conductor such as metal or stainless steel; or a substrate in which the surface of a semiconductor substrate or the surface of a conductive substrate is covered with an insulating material, can be used. Further alternatively, a plastic substrate can be used as the substrate 102 as appropriate.

Further, a glass substrate whose strain point is greater than or equal to 730° C. is preferably used in the case where heat treatment at a high temperature is performed in the manufacturing steps of the transistor. A glass material such as aluminosilicate glass, aluminoborosilicate glass, or barium borosilicate glass is used, for example. In general, by containing a larger amount of barium oxide (BaO) than boric oxide, more practical heat-resistant glass can be obtained. Therefore, a glass substrate containing a larger amount of BaO than $B_2O_3$ is preferably used.

The insulating layer 104 serves as a base to prevent diffusion of an impurity element from the substrate 102 and also serves as a base to prevent the substrate from being etched by etching in the manufacturing steps of the transistor. There is no limitation on the thickness of the insulating layer 104; however, the thickness of the insulating layer 104 is preferably greater than or equal to 50 nm.

The insulating layer 104 is formed with a single-layer structure using any of oxide insulating layers of silicon oxide, silicon oxynitride, silicon nitride oxide, hafnium oxide, aluminum oxide, tantalum oxide, and the like; or a stacked structure including two or more layers selected from these layers. In the case where the stacked structure is adopted, an insulating layer being in contact with the substrate 102 is formed using a silicon nitride and the insulating layer 104 being in contact with the oxide semiconductor layer 108 is formed using the above-mentioned oxide insulating layer. An oxide insulating layer in which the concentration of hydrogen is reduced is used as the insulating layer 104 being in contact with the oxide semiconductor layer 108, whereby, diffusion of hydrogen in the oxide semiconductor layer 108 is prevented and a transistor having favorable electric characteristics can be provided because oxygen is supplied to defects in the oxide semiconductor layer 108 from the insulating layer 104. At this time, as described above, it is necessary that the concentration of hydrogen in the insulating layer 104 be less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$.

Here, a silicon oxynitride means the one that contains more oxygen than nitrogen and for example, silicon oxynitride includes oxygen, nitrogen, and silicon at concentrations ranging from greater than or equal to 50 atomic % and less than or equal to 70 atomic %, greater than or equal to 0.5 atomic % and less than or equal to 15 atomic %, and greater than or equal to 25 atomic % and less than or equal to 35 atomic %, respectively. Further, silicon nitride oxide means the one that contains more nitrogen than oxygen and for example, silicon nitride oxide includes oxygen, nitrogen, and silicon at concentrations ranging from greater than or equal to 5 atomic % and less than or equal to 30 atomic %, greater than or equal to 20 atomic % and less than or equal to 55 atomic %, and greater than or equal to 25 atomic % and less than or equal to 35 atomic %, respectively. Note that rates of oxygen, nitrogen, and silicon fall within the aforementioned ranges in the cases where measurement is performed using Rutherford backscattering spectrometry (RBS) or hydrogen forward scattering (HFS). In addition, the total of the percentages of the constituent elements does not exceed 100 atomic %.

In this embodiment, description is made on the cases where a silicon oxide layer formed by sputtering is used as the insulating layer 104 and a silicon oxide layer formed by a plasma enhanced chemical vapor deposition (plasma CVD) is used as the insulating layer 104.

In the case where the insulating layer 104 is formed by sputtering, a target containing a silicon element is preferably used. That is to say, a Si target or SiO$_2$ target can be used. Preferably, a SiO$_2$ target is used in order to reduce the concentration of hydrogen in the obtained oxide silicon layer, more preferably a SiO$_2$ target in which the concentration of a hydroxyl group contained in the SiO$_2$ target is less than or equal to 1000 ppm or the concentration of hydrogen measured using secondary ion mass spectrometry (SIMS) is less than or equal to $3.5 \times 10^{19}$ atoms/cm$^3$ is used. As gases to be supplied for forming the insulating layer 104, a rare gas such as argon and oxygen are used. Further, it is preferable to use high-purity gas in which impurities such as hydrogen, water, a hydroxyl group, or hydride are reduced to a concentration of a "ppm" level or a "ppb" level as gases to be supplied.

Examples of sputtering include RF sputtering in which a high-frequency power source is used for a sputtering power supply, DC sputtering, and pulsed DC sputtering in which a bias is applied in a pulsed manner.

A multi-source sputtering apparatus in which a plurality of targets of different materials can be placed may be used for forming the insulating layer 104. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber, which is for magnetron sputtering, and a sputtering apparatus which is used for ECR sputtering in which plasma produced with the use of microwaves is used without using glow discharge.

Further, as sputtering, reactive sputtering in which a target substance and a sputtering gas component are chemically reacted with each other to form a thin compound film thereof, or bias sputtering in which voltage is also applied to a substrate can be used.

In this specification, sputtering can be performed while the substrate is heated using the above-described sputtering apparatus and sputtering as appropriate.

Thus, the concentration of hydrogen in the obtained oxide silicon layer can be less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$.

In addition to sputtering, plasma CVD can be used for the formation of the insulating layer 104. Plasma CVD is a method for forming a film by supplying a deposition gas to be raw materials to a reaction chamber of a plasma CVD apparatus to employ plasma energy.

As the plasma CVD apparatus, a capacitively coupled high-frequency plasma CVD apparatus using a high-frequency power source, an inductively coupled high-frequency plasma CVD apparatus, a microwave plasma CVD apparatus (an electron cyclotron resonant plasma CVD apparatus) which has magnetron that is a microwave generation source and generates plasma using the microwave, and a helicon wave plasma CVD apparatus are given. In plasma CVD of this specification, a CVD apparatus in which glow discharge plasma is utilized for the formation of the film can be used as appropriate. Further, plasma CVD can be also performed while the substrate is heated.

When the insulating layer 104 in which the concentration of hydrogen is reduced is formed by plasma CVD, a gas in which hydrogen is not contained in its molecular structure is needed to be selected as the deposition gas.

In other words, as the deposition gas, not SiH$_4$ but SiF$_4$ is used. Further, an oxidizing gas of N$_2$O or O$_2$ with a low content of hydrogen and water is also used so that a film to be deposited is an oxide insulating film. Further, a gas with a low content of hydrogen and water is used also as the other gases to be added (a rare gas such as argon) in consideration of the spread of plasma generated in the plasma CVD apparatus.

When the oxide silicon layer to be the insulating layer 104 is formed by plasma CVD, impurities such as hydrogen and water which remain in the reaction chamber of the plasma CVD apparatus or adsorb onto the inner wall of the reaction chamber are removed, and then the oxide silicon layer is formed using the above-mentioned gases. In this manner, the concentration of hydrogen in the insulating layer 104 formed by plasma CVD can be less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$.

The source electrode layer 106*a* and the drain electrode layer 106*b* are formed over the insulating layer 104. The source electrode layer 106*a* and the drain electrode layer 106*b* can be formed with a single layer or a stacked layer using a conductive film of a metal material such as molybdenum, titanium, chromium, tantalum, tungsten, neodymium, or scandium, or an alloy material which contains any of these metal materials as a main component, or a nitride of any of these metals. Note that aluminum or copper can also be used as such a metal material if it can withstand the temperature of heat treatment to be performed in a later process. Aluminum or copper is preferably used in combination with a refractory metal material in order to avoid problems of heat resistance and corrosion. As the refractory metal material, molybdenum, titanium, chromium, tantalum, tungsten, neodymium, scandium, or the like can be used.

For example, the following structure is preferable as a two-layer structure of the source electrode layer 106*a* and the drain electrode layer 106*b*: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; a two-layer structure in which a titanium nitride film and a molybdenum film are stacked; or a two-layer structure in which a copper film is stacked over a copper-magnesium-aluminum alloy film. As a three-layer structure of the source electrode layer 106a and the drain electrode layer 106b, the following structure is preferable: a stacked structure including an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, a light-transmitting oxide conductive film of indium oxide, an alloy of indium oxide and tin oxide, an alloy of indium oxide and zinc oxide, zinc oxide, aluminum zinc oxide, aluminum zinc oxynitride, gallium zinc oxide, or the like may be used for the source electrode layer 106a and the drain electrode layer 106b.

The thickness of the source electrode layer 106a and the drain electrode layer 106b is not particularly limited and can be determined as appropriate in consideration of electric resistance and time required for a manufacturing process of the conductive film serving as the source electrode layer 106a and the drain electrode layer 106b. For example, the source electrode layer 106a and the drain electrode layer 106b can be formed to have thickness of 10 nm to 500 nm.

The oxide semiconductor layer 108 which forms a channel region is formed so as to be in contact with part of the upper surfaces of the source electrode layer 106a and the drain electrode layer 106b and part of the upper surface of the insulating layer 104. Because the concentration of hydrogen in the insulating layer 104 is less than $6\times10^{20}$ atoms/cm$^3$, preferably less than or equal to $5\times10^{20}$ atoms/cm$^3$, more preferably less than or equal to $5\times10^{19}$ atoms/cm$^3$ as described above, diffusion of hydrogen in the oxide semiconductor layer 108 can be prevented when the oxide semiconductor layer 108 is formed. The thickness of the oxide semiconductor layer 108 is set to 10 nm to 300 nm, preferably 20 nm to 100 nm.

The oxide semiconductor layer 108 is formed using an In—Ga—Zn—O-based non-single-crystal film which contains In, Ga, and Zn and has a structure represented as InMO$_3$(ZnO)$_m$ (m>0). Note that M denotes one or more of metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga in other cases. Further, the above oxide semiconductor may contain Fe or Ni, another transitional metal element, or an oxide of the transitional metal as an impurity element in addition to the metal element contained as M. In addition, a metal oxide contained in the metal oxide target have a relative density of higher than or equal to 80%, preferably higher than or equal to 95%, more preferably higher than or equal to 99.9% is used.

Specifically, the oxide semiconductor layer 108 can be formed using any of the following oxide semiconductors: an oxide of four metal elements such as an In—Sn—Ga—Zn—O-based oxide semiconductor; oxides of three metal elements such as an In—Ga—Zn—O—based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; oxides of two metal elements such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor; and oxides of one metal element such as an In—O-based oxide semiconductor, a Sn—O-based oxide semiconductor, and a Zn—O-based oxide semiconductor. Here, for example, an In—Ga—Zn—O-based oxide semiconductor is an oxide semiconductor containing at least In, Ga, and Zn, and there is no particular limitation on the composition ratio thereof. The In—Ga—Zn—O-based oxide semiconductor may contain an element other than In, Ga, and Zn. Moreover, silicon oxide may be included in the above oxide semiconductor layer.

The gate insulating layer 110 is formed so as to cover the source electrode layer 106a, the drain electrode layer 106b, and the oxide semiconductor layer 108. The gate insulating layer 110 is formed using an oxide insulating layer, similarly to the insulating layer 104. The gate insulating layer 110 is formed with a low hydrogen content, whereby a semiconductor device having favorable electric characteristics can be obtained. Thus, it is preferable that the concentration of hydrogen in the gate insulating layer being in contact with the oxide semiconductor layer be less than $6\times10^{20}$ atoms/cm$^3$, preferably less than or equal to $5\times10^{20}$ atoms/cm$^3$, more preferably less than or equal to $5\times10^{19}$ atoms/cm$^3$.

The gate electrode 112 is formed so as to overlap with the oxide semiconductor layer 108 with the gate insulating layer 110 interposed therebetween. The gate electrode 112 can have a structure similar to that of the source electrode layer 106a and the drain electrode layer 106b.

Figure 1B:
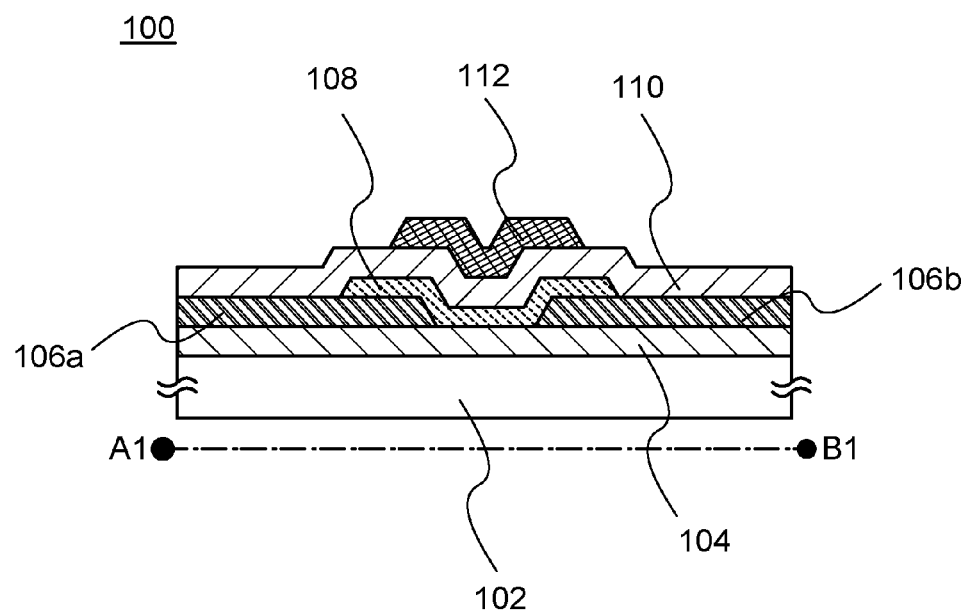

Although not illustrated in FIGS. 1A and 1B, an insulating layer serving as a passivation layer or an interlayer insulating layer is preferably formed over the transistor.

As described above, the concentration of hydrogen in one or both of the insulating layer 104 and the gate insulating layer 110 is less than $6\times10^{20}$ atoms/cm$^3$, preferably less than or equal to $5\times10^{20}$ atoms/cm$^3$, more preferably less than or equal to $5\times10^{19}$ atoms/cm$^3$; thus, diffusion of hydrogen in the oxide semiconductor layer 108 can be prevented and a semiconductor device having favorable electric characteristics can be obtained.

Note that the structure described in this embodiment can be combined as appropriate with any structure described in the other embodiments in this specification.

Embodiment 2

Note that a method for manufacturing the semiconductor device described in Embodiment 1 is described in this embodiment with reference to FIGS. 2A to 2D.

Figure 2A:
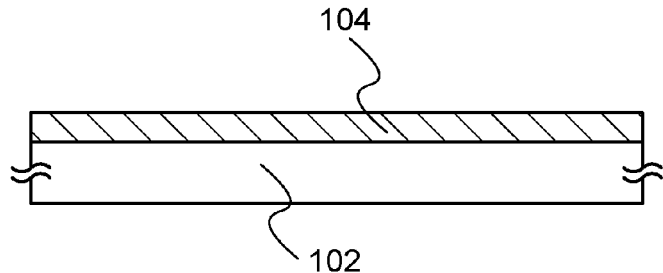
FIGS. 2A to 2D are cross-sectional views illustrating a method for manufacturing a transistor.

As illustrated in FIG. 2A, the insulating layer 104 is formed over the substrate 102. The material described in Embodiment 1 can be used for the substrate 102 and the insulating layer 104. In this embodiment, a glass substrate is used for the substrate 102. As the insulating layer 104, a silicon oxide layer is formed to have a thickness of 200 nm by RF sputtering using SiO$_2$ as a target and a rare gas such as argon and oxygen as gases to be supplied when the insulating layer 104 is formed.

As described in Embodiment 1, when the insulating layer 104 is formed by plasma CVD, the inner wall of the reaction chamber in the plasma CVD apparatus is heated to release impurities from the inner wall of the reaction chamber and remove impurities remaining in the reaction chamber or adsorbing onto the inner wall of the reaction chamber. Then, SiF$_4$ as the deposition gas, N$_2$O the oxidizing gas, and argon as the gas to be added are supplied to the reaction chamber, whereby the insulating layer 104 is formed using plasma energy. In this embodiment, a plasma CVD apparatus using a high-frequency power source is used.

As a method for removing the impurities remaining in the reaction chamber or adsorbing onto the inner wall of the reaction chamber, an exhaust process, plasma cleaning using a fluorine compound such as nitrogen trifluoride, or the like is preferably performed.

Next, the conductive film serving as the source electrode layer 106a and the drain electrode layer 106b is formed. As the conductive film, in this embodiment, a titanium film with a thickness of 150 nm is formed by DC sputtering using a titanium target. Then, the source electrode layer 106a and the drain electrode layer 106b each having a thickness of 150 nm are formed by performing a first photolithography step and an etching step.

Either wet etching or dry etching may be used for the etching of the conductive film. Note that dry etching is preferably used in terms of microfabrication of the element. An etching gas and an etchant can be selected as appropriate depending on a material of layers to be etched.

Note that the side surfaces of the source electrode layer 106a and the drain electrode layer 106b are formed to have a tapered shape. This is in order to prevent disconnection at a step portion because the oxide semiconductor film and the conductive film to be the gate electrode are formed over the source electrode layer 106a and the drain electrode layer 106b in a later step. In order to form the side surfaces of the source electrode layer 106a and the drain electrode layer 106b to be tapered, etching may be performed while the resist mask is recessed.

Next, the oxide semiconductor film with a thickness of 50 nm is formed by DC sputtering. Oxygen is supplied to defects in the oxide semiconductor layer from the insulating layer 104 because the oxide semiconductor film is formed to be in contact with the insulating layer 104. Then, an oxide semiconductor layer 107 that is processed into an island shape is formed by performing a photolithography step or an etching step. In this embodiment, DC sputtering is used; however, vacuum evaporation, pulse laser deposition, CVD, and the like may be used.

As the oxide semiconductor film, the oxide semiconductor described in Embodiment 1 can be used. In this embodiment, as the oxide semiconductor film, an In—Ga—Zn—O-based non-single-crystal film with a thickness of 50 nm is formed by sputtering using an oxide semiconductor target including indium (In), gallium (Ga), and zinc (Zn) ($In_2O_3:Ga_2O_3:ZnO=1:1:1$ and $In_2O_3:Ga_2O_3:ZnO=1:1:2$ in a molar ratio). Further, in this embodiment, DC sputtering is employed, a flow rate of argon is 30 sccm, a flow rate of oxygen is 15 sccm, and a substrate temperature is a room temperature (15° C. to 35° C.).

In the case where an In—Zn—O-based oxide semiconductor film is used as the oxide semiconductor film, a target used has a composition ratio of In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), further preferably In:Zn=15:1 to 3:2 ($In_2O_3:ZnO=15:2$ to 3:4 in a molar ratio). For example, in a target used for formation of an In—Zn—O-based oxide semiconductor which has an atomic ratio of In:Zn:O=X:Y:Z, the relation of $Z>1.5X+Y$ is satisfied.

Before the oxide semiconductor film is formed by sputtering, reverse sputtering in which plasma is generated by introduction of an argon gas is preferably performed. The reverse sputtering refers to a method in which an RF power source is used for application of voltage to a substrate in an argon atmosphere and plasma is generated around the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

In forming the oxide semiconductor film, the substrate is held in a treatment chamber that is maintained at reduced pressure and is heated so that the substrate temperature is higher than or equal to 100° C. and lower than 550° C., preferably higher than or equal to 200° C. and lower than or equal to 400° C. Alternatively, the substrate temperature in forming the oxide semiconductor film may be a room temperature (15° C. to 35° C.). Then, moisture in the treatment chamber is removed, a sputtering gas from which hydrogen, water, or the like has been removed is introduced, and the oxide semiconductor target is used; thus, the oxide semiconductor film is formed. The oxide semiconductor film is formed while the substrate is heated, so that impurities contained in the oxide semiconductor film can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. Since it is possible to remove hydrogen, water, or the like from the treatment chamber by evacuating the treatment chamber with a cryopump or the like, the concentration of an impurity in the oxide semiconductor film can be reduced.

Figure 2B:
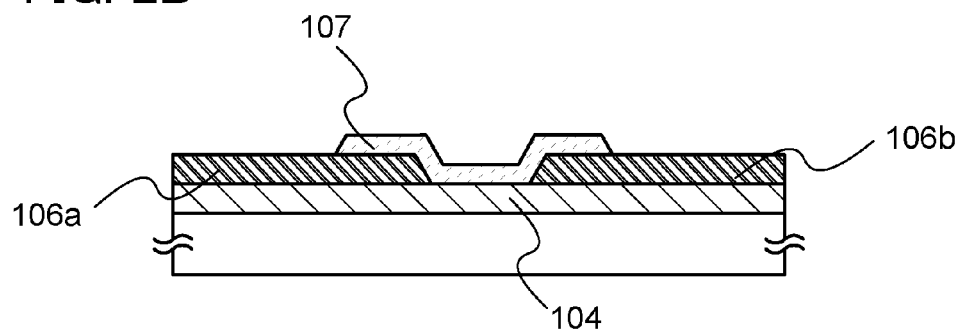

The structure provided through the steps up to here is illustrated in FIG. 2B.

Then, the oxide semiconductor layer 107 may be subjected to heat treatment in the atmosphere, an inert gas atmosphere (nitrogen, helium, neon, argon, or the like), or in the atmosphere where the dew point under atmospheric pressure is less than or equal to −60° C. and the moisture content is small. Specifically, the oxide semiconductor layer 107 is subjected to heat treatment in the atmosphere at greater than or equal to 100° C. and less than or equal to 400° C. for 10 minutes or more, preferably at 350° C. for 60 minutes. In this embodiment, the oxide semiconductor layer 107 is subjected to heat treatment, whereby the oxide semiconductor layer 108 in which moisture and hydrogen are eliminated is formed. At that time, oxygen is supplied to defects in the oxide semiconductor layer 108 from the insulating layer 104.

Furthermore, rapid thermal annealing (RTA) treatment can be performed in an inert gas atmosphere (such as nitrogen, helium, neon, or argon) at a temperature of higher than or equal to 500° C. and lower than or equal to 750° C. (or a temperature lower than or equal to the strain point of the glass substrate) for approximately 1 minute to 10 minutes, preferably at 600° C. for approximately 3 minutes to 6 minutes. Since dehydration or dehydrogenation can be performed in a short time with RTA treatment, the heat treatment can be performed even at a temperature over the strain point of a glass substrate. Note that in the heat treatment, it is preferable that water, hydrogen, and the like be not contained in the inert gas (nitrogen or a rare gas such as helium, neon, or argon) atmosphere or in the oxygen atmosphere. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Note that the timing of the above heat treatment is not limited to after formation of the island-shaped oxide semiconductor layer 108, and the oxide semiconductor film before being processed into the island-shaped oxide semiconductor layer 108 may be subjected to the heat treatment. The heat treatment may be performed more than once after the oxide semiconductor film 107 is formed.

In this embodiment, heat treatment is performed for 60 minutes in the atmosphere in the state where the substrate temperature reaches 350° C. Further, heating with the use of an electric furnace, rapid heating such as gas rapid thermal annealing (GRTA) using a heated gas or lamp rapid thermal annealing (LRTA) using lamp light, or the like can be used for the heat treatment. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

The island-shaped oxide semiconductor layer 108 which has been subjected to the heat treatment in an inert gas atmosphere is preferably in an amorphous state, but may be partly crystallized.

Here, plasma treatment using oxygen, ozone, or dinitrogen monoxide may be performed on an exposed surface of the oxide semiconductor layer 108. By performing the plasma treatment, oxygen can be supplied to defects of the oxide semiconductor layer 108.

Next, the gate insulating layer 110 is formed. Note that the gate insulating layer 110 can be formed in a manner similar to that of the insulating layer 104. In this embodiment, a silicon oxide layer with a thickness of 200 nm is formed by RF sputtering using $SiO_2$ as a target and a rare gas such as argon and oxygen as gases to be supplied when the gate insulating layer 110 is formed.

Figure 2C:
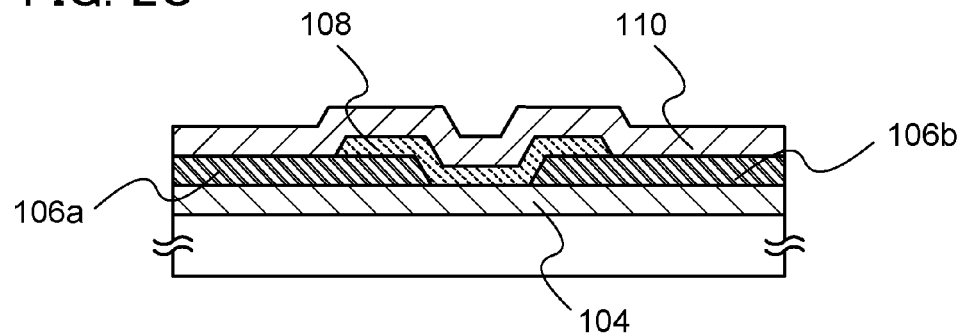

The structure obtained through the steps up to here is illustrated in FIG. 2C.

After the gate insulating layer 110 is formed, heat treatment may be performed. The heat treatment is performed in the atmosphere or an inert gas atmosphere (nitrogen, helium, neon, argon, or the like). The heat treatment is preferably performed at a temperature of greater than or equal to 200° C. and less than or equal to 400° C. In this embodiment, the heat treatment is preferably performed at 350° C. for 1 hour in the atmosphere. Alternatively, RTA treatment for a short time at a high temperature may be performed in a similar manner to the heat treatment performed before forming the gate insulating layer 110. The timing of this heat treatment is not particularly limited as long as it is after the formation of the gate insulating layer 110, and can be performed without increasing the number of manufacturing steps by doubling as another step such as a heat treatment for reducing the resistance of a transparent conductive film.

A conductive film serving as the gate electrode layer 112 is formed over the gate insulating layer 110, and a third photolithography step and an etching step are performed, whereby the gate electrode layer 112 is formed. The conductive film can have a structure similar to that of the source electrode layer 106a and the drain electrode layer 106b. In this embodiment, a titanium film with a thickness of 150 nm is formed by DC sputtering using a titanium target. Then, the gate electrode layer 112 is formed by performing the third photolithography step and the etching step.

Figure 2D:
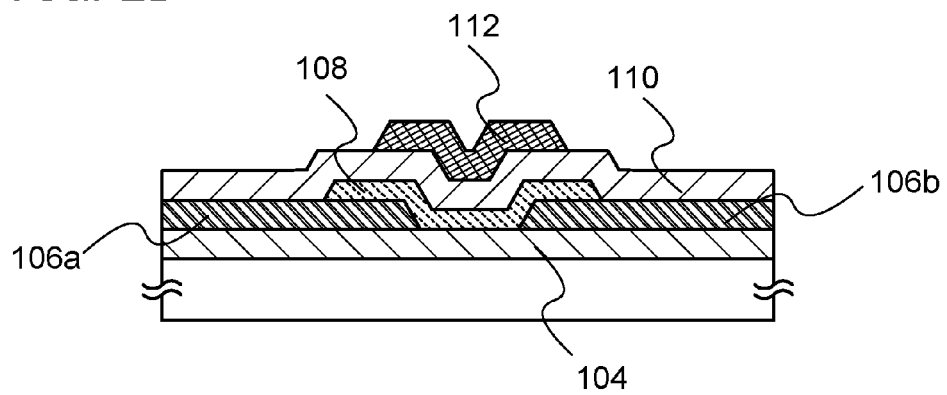

The structure obtained through the steps up to here is illustrated in FIG. 2D.

In the foregoing manner, the semiconductor device of Embodiment 1 can be manufactured.

Embodiment 3

In this embodiment, a semiconductor device which is another embodiment of the present invention is described with reference to FIGS. 3A and 3B.

Figure 3A:
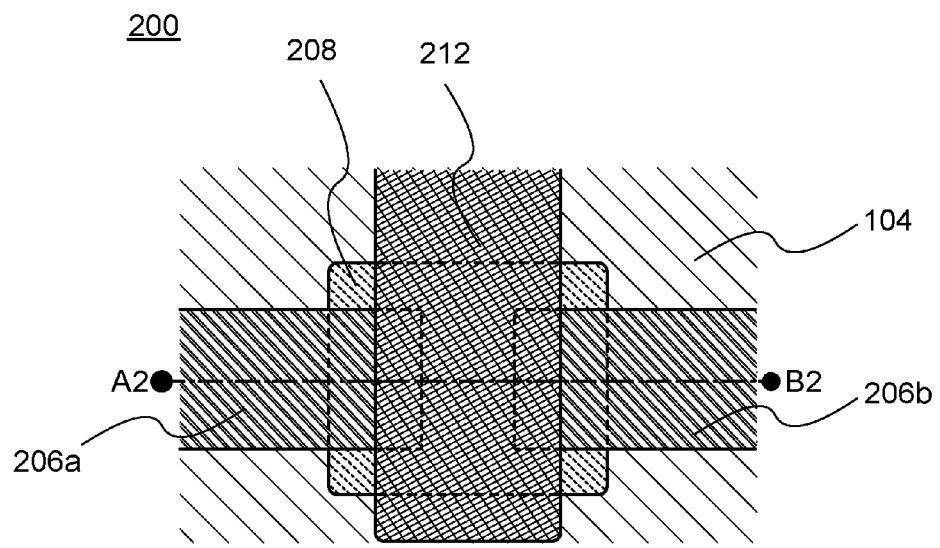
FIGS. 3A and 3B illustrate a top view and a cross-sectional view of a transistor, respectively.

FIG. 3A is a top view of a transistor 200 included in a semiconductor device.

Figure 3B:
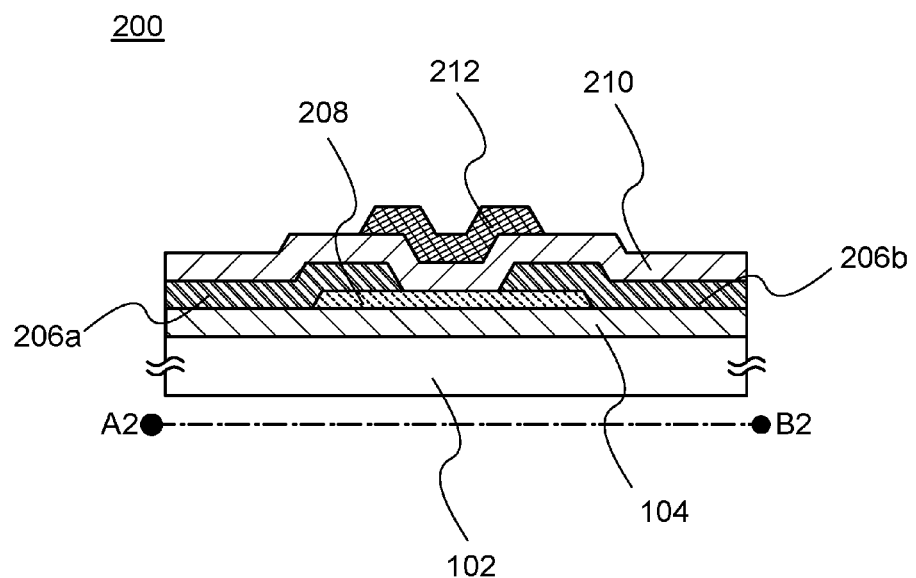

FIG. 3B is a cross-sectional view taken along line A2-B2 of FIG. 3A. The transistor 200 include, over the substrate 102, the insulating layer 104, an oxide semiconductor layer 208 which forms a channel region, a source electrode layer 206a and a drain electrode layer 206b, a gate insulating layer 210, and a gate electrode layer 212.

The transistor 200 is a transistor having a top-gate structure, in which the gate electrode layer 212 overlaps with the oxide semiconductor layer 208 with the gate insulating layer 210 interposed therebetween. Further, the transistor 200 is a top-contact transistor including the oxide semiconductor layer 208 between the source and drain electrode layers 206a and 206b and the insulating layer 104.

The transistor 200 is a top-gate/bottom-contact transistor, so that part of the upper surface of the insulating layer 104 and part of the lower surface of the oxide semiconductor layer 208 are in contact with each other. Therefore, in manufacturing steps of the transistor 200, hydrogen is diffused into the oxide semiconductor layer 208 when a large amount of hydrogen exists in the insulating layer 104. Hydrogen is diffused into the oxide semiconductor layer 208, so that excessive carriers are generated in the oxide semiconductor layer 208. Thus, the threshold voltage of the transistor 200 shifts in the negative direction, and drain current flows even in the state (Vg=0V) where voltage is not applied to the gate electrode (normally-on). Therefore, electric characteristics of the transistor 200 are degraded.

There is a method in which the oxide semiconductor layer 208 is subjected to heat treatment in order to remove the diffused hydrogen from the oxide semiconductor layer 208. However, as the manufacturing steps of the transistor are increased, manufacturing cost is increased and yield may be reduced.

Thus, an insulating layer in which the concentration of hydrogen is less than $6\times10^{20}$ atoms/cm$^3$, preferably less than or equal to $5\times10^{20}$ atoms/cm$^3$, more preferably less than or equal to $5\times10^{19}$ atoms/cm$^3$ is used as the insulating layer 104 being in contact with the oxide semiconductor layer 208, whereby diffusion of hydrogen in the oxide semiconductor layer 208 can be prevented and a transistor having favorable electric characteristics can be provided. Accordingly, a transistor having favorable electric characteristics can be provided without increasing the number of manufacturing steps of the transistor.

Further, the concentration of hydrogen in the gate insulating layer 210 can be less than $6\times10^{20}$ atoms/cm$^3$, preferably less than or equal to $5\times10^{20}$ atoms/cm$^3$, more preferably less than or equal to $5\times10^{19}$ atoms/cm$^3$. In other words, the concentration of hydrogen in each of the insulating layer 104 and the gate insulating layer 210 is less than $6\times10^{20}$ atoms/cm$^3$, preferably less than or equal to $5\times10^{20}$ atoms/cm$^3$, more preferably less than or equal to $5\times10^{19}$ atoms/cm$^3$, whereby diffusion of hydrogen in the oxide semiconductor layer 208 can be suppressed.

The substrate 102 in this embodiment is similar to the substrate 102 described in Embodiment 1.

The insulating layer 104 has a structure similar to that described in Embodiment 1. The insulating layer 104 serves as a base to prevent diffusion of an impurity element from the substrate 102 and also serves as a base to prevent the substrate from being etched by etching in the manufacturing steps of the transistor. There is no limitation on the thickness of the insulating layer 104; however, the thickness of the insulating layer 104 is preferably greater than or equal to 50 nm.

The insulating layer 104 is formed with a single-layer structure using any of oxide insulating layers of silicon oxide, silicon oxynitride, silicon nitride, silicon nitride oxide, hafnium oxide, aluminum oxide, tantalum oxide, and the like; or a stacked structure including two or more layers selected from these layers. In the case where the stacked structure including two or more layers is adopted, an insulating layer being in contact with the substrate 102 is formed using a silicon nitride and the insulating layer 104 being in contact with the oxide semiconductor layer 108 is formed using the above-mentioned oxide insulating layer. An oxide insulating layer in which the concentration of hydrogen is reduced is used as the insulating layer 104 being in contact with the oxide semiconductor layer 208, whereby, oxygen is supplied to defects of the oxide semiconductor layer 208 from the insulating layer 104. Thus, a transistor having favorable electric characteristics can be provided. At this time, as described above, it is necessary that the concentration of hydrogen in the insulating layer 104 be less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$.

As the insulating layer 104 in this embodiment, a silicon oxide layer formed by sputtering or a silicon oxide layer formed by plasma CVD can be used as described in Embodiment 1.

In the case where the insulating layer 104 is formed by sputtering, a target containing a silicon element is preferably used. That is to say, a Si target or SiO$_2$ target can be used. Preferably, a SiO$_2$ target is used in order to reduce the concentration of hydrogen in the obtained oxide silicon layer; more preferably a SiO$_2$ target in which the concentration of a hydroxyl group contained in the SiO$_2$ target is less than or equal to 1000 ppm or the concentration of hydrogen measured using secondary ion mass spectrometry (SIMS) is less than or equal to $3.5 \times 10^{19}$ atoms/cm$^3$ is used. As gases to be supplied for forming the insulating layer 104, a rare gas such as argon and oxygen are used. Further, it is preferable to use high-purity gas in which impurities such as hydrogen, water, a hydroxyl group, or hydride are reduced to a concentration of a "ppm" level or a "ppb" level as gases to be supplied.

The insulating layer 104 can be formed by plasma CVD instead of sputtering. Plasma CVD is a method for forming a film by supplying a deposition gas to be raw materials to a reaction chamber of a plasma CVD apparatus to employ plasma energy.

When the oxide silicon layer is formed by plasma CVD, a gas in which hydrogen is not contained in its molecular structure as the deposition gas is needed to be selected.

As the deposition gas, not SiH$_4$ but SiF$_4$ is used. Further, as a gas for oxidation, N$_2$O or O$_2$ with a low content of hydrogen and water is used. Further, a gas with a low content of hydrogen and water is used also as the other gases to be added (a rare gas such as argon) in consideration of the spread of plasma.

Furthermore, the silicon oxide layer is formed by plasma CVD using the gas having the above-described structure after impurities remaining in the reaction chamber or adsorbing onto the inner wall of the reaction chamber are removed. In such a manner, the concentration of hydrogen in the insulating layer 104 formed by plasma CVD can be less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$.

The oxide semiconductor layer 208 which forms a channel region is formed over the insulating layer 104. The oxide semiconductor layer 208 is similar to the oxide semiconductor layer 108 in Embodiment 1. As described in Embodiment 1, the concentration of hydrogen in the insulating layer 104 is less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$, whereby diffusion of hydrogen in the oxide semiconductor layer 208 is prevented when the oxide semiconductor layer 208 is formed.

The gate insulating layer 210 is formed so as to cover the source electrode layer 206a, the drain electrode layer 206b, and the oxide semiconductor layer 208. The gate insulating layer 210 is similar to the gate insulating layer 110 in Embodiment 1. Further, an oxide insulating layer with a low hydrogen content, similarly to the insulating layer 104, is used as the gate insulating layer 210, whereby a semiconductor device having favorable electric characteristics can be obtained. Thus, it is preferable that the concentration of hydrogen in the gate insulating layer being in contact with the oxide semiconductor layer be less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$.

The source electrode layer 206a and the drain electrode layer 206b are formed over part of the upper surface of the insulating layer 104 and part of the upper surface of the oxide semiconductor layer 208. The source electrode layer 206a and the drain electrode layer 206b are similar to the source electrode layer 106a and the drain electrode layer 106b in Embodiment 1.

The gate electrode 212 is formed so as to overlap with the oxide semiconductor layer 208 with the gate insulating layer 210 interposed therebetween. The gate electrode 212 is similar to the gate electrode 112 in Embodiment 1.

Although not illustrated in FIGS. 3A and 3B, an insulating layer serving as a passivation layer or an interlayer insulating layer is preferably formed over the transistor 200.

As described above, the concentration of hydrogen in the insulating layer 104 and the gate insulating layer 210 is less than $6 \times 10^{20}$ atoms/cm$^3$, preferably less than or equal to $5 \times 10^{20}$ atoms/cm$^3$, more preferably less than or equal to $5 \times 10^{19}$ atoms/cm$^3$, whereby diffusion of hydrogen in the oxide semiconductor layer 208 can be prevented and a semiconductor device having favorable electric characteristics can be obtained.

Note that the structure described in this embodiment can be combined as appropriate with any structure described in the other embodiments in this specification.

Embodiment 4

In this embodiment, a method for manufacturing the semiconductor device illustrated in Embodiment 3 is described with reference to FIGS. 4A to 4D.

Figure 4A:
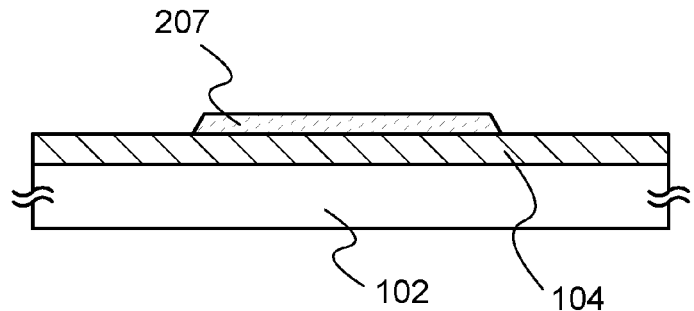
FIGS. 4A to 4D are cross-sectional views illustrating a method for manufacturing a transistor.
Figure 4B:
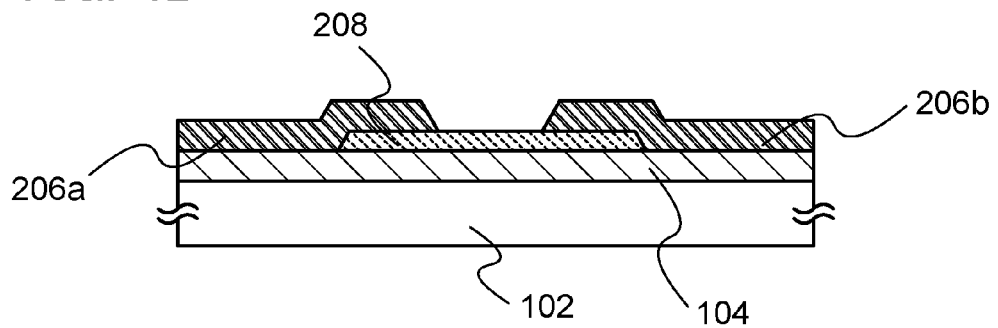

As shown in FIG. 4A, the insulating layer 104 is formed over the substrate 102. The substrate 102 and the insulating layer 104 illustrated in Embodiment 3 can be used. In this embodiment, a glass substrate is used for the substrate 102. As the insulating layer 104, a silicon oxide layer with a thickness of 200 nm is formed by RF sputtering using SiO$_2$ as a target and a rare gas such as argon and oxygen as gases to be supplied when the insulating layer 104 is formed.

The insulating layer 104 can be formed as described in Embodiment 2 when it is formed by plasma CVD, Then, an oxide semiconductor film with a thickness of 50 nm is formed by sputtering. Because the oxide semiconductor film is formed to be in contact with the insulating layer 104, oxygen is supplied to defects in the oxide semiconductor layer from the insulating layer 104. After that, the oxide semiconductor layer 207 that is processed into an island shape is formed by performing the first photolithography step or the etching step.

The oxide semiconductor film can be formed as described in Embodiment 2.

The structure obtained through the steps up to here is illustrated in FIG. 4A.

Next, the conductive film serving as the source electrode layer 206a and the drain electrode layer 206b is formed. As the conductive film, in this embodiment, a titanium film with a thickness of 150 nm is formed by DC sputtering using a titanium target as in Embodiment 2. Then, the source electrode layer 206a and the drain electrode layer 206b each having a thickness of 150 nm are formed by performing a second photolithography step and an etching step.

Etching of the conductive film can be performed in a similar manner to that described in Embodiment 2.

Then, the oxide semiconductor layer 207 may be subjected to heat treatment in the atmosphere, an inert gas atmosphere (nitrogen, helium, neon, argon, or the like), or in the atmosphere where the dew point under atmospheric pressure is less than or equal to −60° C. and the moisture content is small. Specifically, the oxide semiconductor layer 207 is subjected to heat treatment in the atmosphere at greater than or equal to 100° C. and less than or equal to 400° C. for 10 minutes or more, preferably at 350° C. for 60 minutes. In this embodiment, the oxide semiconductor layer 207 is subjected to heat treatment, whereby the oxide semiconductor layer 208 in which moisture and hydrogen are eliminated is formed. At that time, oxygen is supplied to defects in the oxide semiconductor layer 208 from the insulating layer 104.

Note the heat treatment is not necessarily performed after the source electrode layer 206a and the drain electrode layer 206b are formed, and the heat treatment may be performed on the island-shaped oxide semiconductor film 207 formed by performing the first photolithography step and the etching step before forming the source electrode layer 206a and the drain electrode layer 206b. The heat treatment may also be performed plural times after forming the oxide semiconductor layer 207.

In this embodiment, heat treatment is performed at 350° C. for 60 minutes in the atmosphere in the state where the substrate temperature reaches 350° C.

Here, plasma treatment using oxygen, ozone, or dinitrogen monoxide may be performed on an exposed surface of the oxide semiconductor layer 208. By performing the plasma treatment, oxygen can be supplied to defects in the oxide semiconductor layer 208.

Next, the gate insulating layer 210 is formed. Note that the gate insulating layer 210 can be formed in a manner similar to that of the gate insulating layer 104. In this embodiment, a silicon oxide layer with a thickness of 200 nm is formed by RF sputtering using $SiO_2$ as a target and a rare gas such as argon and oxygen as gases to be supplied when the gate insulating layer 210 is formed.

Figure 4C:
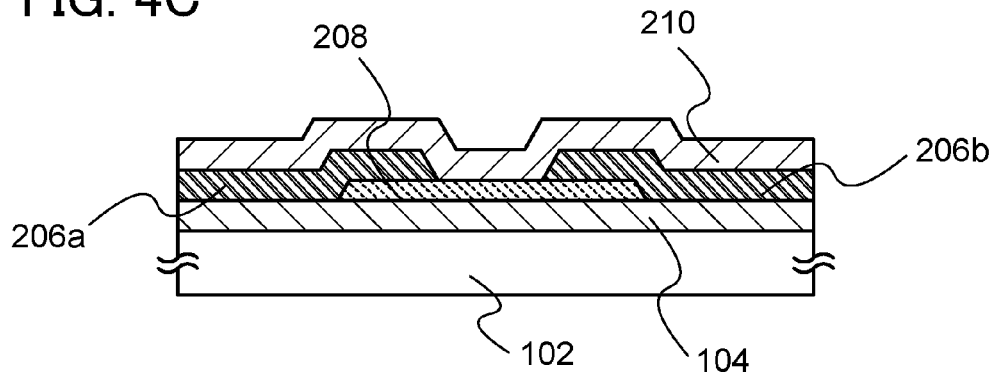

The structure obtained through the steps up to here is illustrated in FIG. 4C.

After the gate insulating layer 210 is formed, heat treatment may be performed. The heat treatment can be performed by a method which is similar to that in Embodiment 2, and the heat treatment can also be performed at the timing which is the same as the timing described in Embodiment 2.

A conductive film serving as the gate electrode layer 212 is formed over the gate insulating layer 210. Then, the gate electrode layer 212 is formed by performing the third photolithography step or the etching step. The conductive film can have a structure similar to that of the source electrode layer 206a and the drain electrode layer 206b. In this embodiment, a titanium film with a thickness of 150 nm is formed by DC sputtering using a titanium target as in Embodiment 2. Then, the gate electrode layer 212 is formed by performing the third photolithography step and the etching step.

Figure 4D:
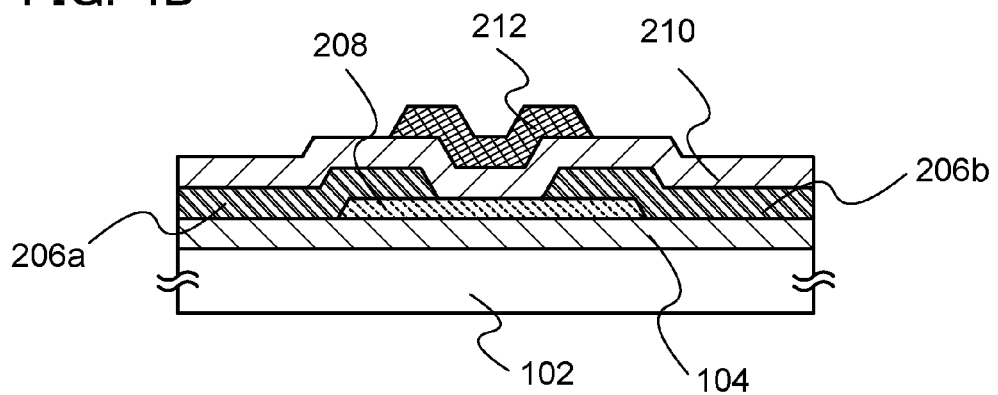

The structure obtained through the steps up to here is illustrated in FIG. 4D.

As described above, a semiconductor device illustrated in Embodiment 3 can be manufactured.

Note that the structure described in this embodiment can be combined as appropriate with any structure described in the other embodiments in this specification.

Embodiment 5

The transistor described in the above embodiments is manufactured, and a semiconductor device having a display function (also referred to as a display device) can be manufactured using the transistor for a pixel portion and further for a driver circuit. Further, part of or the entire driver circuit including the transistors can be formed over a substrate where the pixel portion is formed; thus, a system-on-panel can be obtained. Further, a semiconductor device including a memory cell can be manufactured using the transistors in which the oxide semiconductor described in the above embodiments is used.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state where only a pixel electrode of the display element is formed, a state where a conductive film to be a pixel electrode is formed but is not etched yet to form the pixel electrode, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

Embodiment 6

A display device using the transistor described in the above embodiments can be used for an electronic paper in which electronic ink is driven to perform display. An electronic paper can be used for electronic devices of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like. An example of the electronic device is illustrated in FIG. 5.

Figure 5:
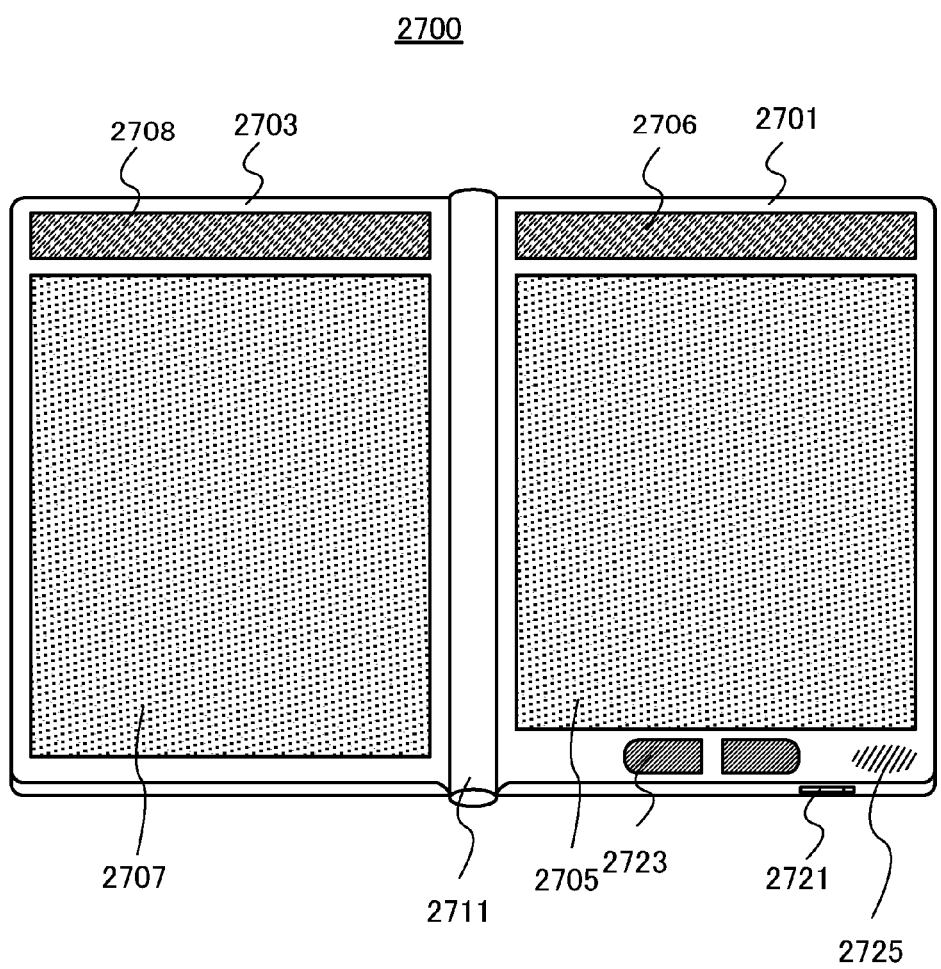
FIG. 5 is an external view illustrating an example of an electronic book reader.

FIG. 5 illustrates an e-book reader 2700 as an example the electronic device. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. In the case where the display portion 2705 and the display portion 2707 display different images, for example, text can be displayed on a display portion on the right side (the display portion 2705 in FIG. 5) and graphics can be displayed on a display portion on the left side (the display portion 2707 in FIG. 5).

FIG. 5 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Embodiment 7

A semiconductor device disclosed in this specification can be applied to a variety of electronic devices (including game machines). Examples of electronic devices are a television device (also referred to as a television or a television receiver), a monitor of a computer or the like, electronic paper, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like.

Figure 6A:
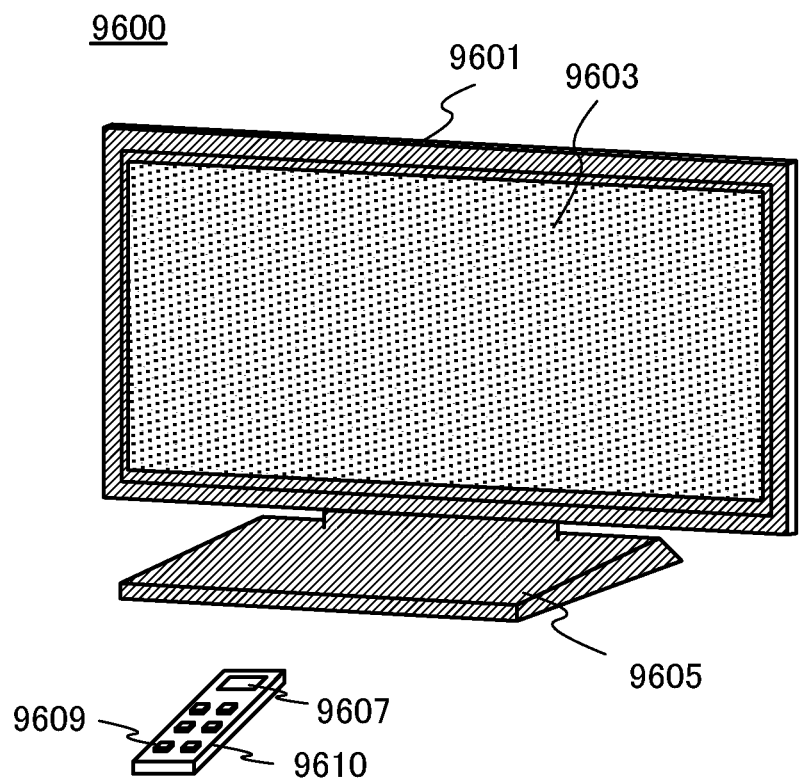
FIGS. 6A and 6B are external views illustrating respective examples of a television device and a digital photo frame.

FIG. 6A illustrates a television set 9600 as an example of an electronic device. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 6B:
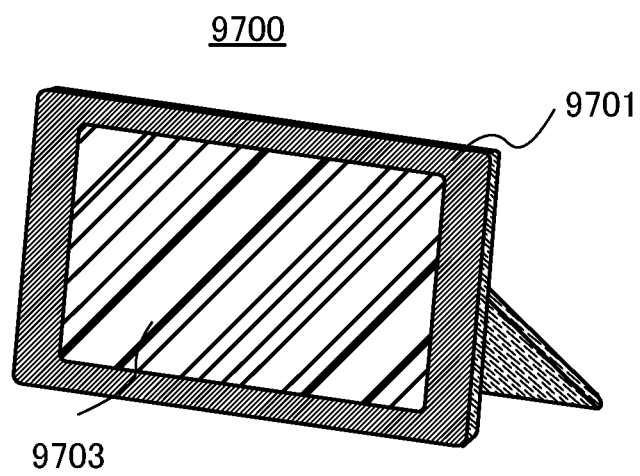

FIG. 6B illustrates a digital photo frame 9700 as an example of an electronic device. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 7:
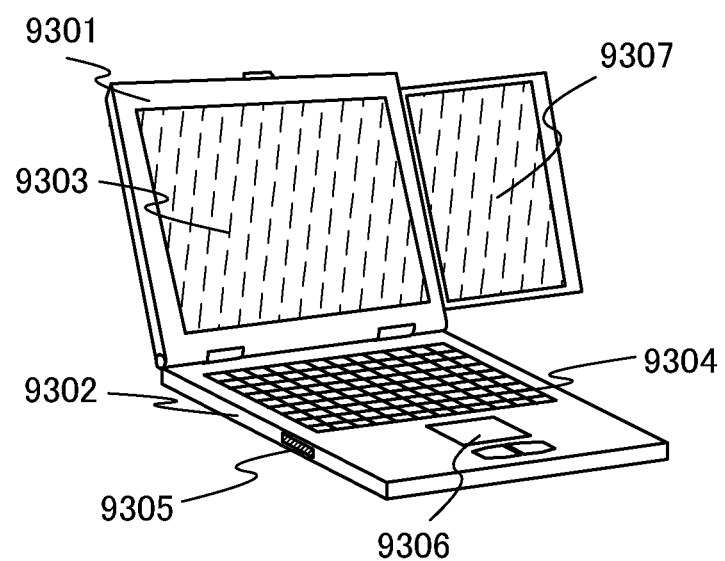
FIG. 7 is a perspective view illustrating an example of a portable computer.

FIG. 7 is a perspective view illustrating an example of a portable computer.

In the portable computer of FIG. 7, a top housing 9301 having a display portion 9303 and a bottom housing 9302 having a keyboard 9304 can overlap with each other by closing a hinge unit which connects the top housing 9301 and the bottom housing 9302. Thus, the portable computer illustrated in FIG. 7 is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the portable computer in FIG. 7, which can be provided with a receiver and the like, can receive a television broadcast to display an image on the display portion 9303 or the display portion 9307. The user can watch television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying television broadcast is performed. Therefore, power can be consumed to the minimum, which is useful for the portable computer whose battery capacity is limited.

Example 1

In the insulating layers described in the above embodiments, the concentration of hydrogen included in the following insulating layers A and B is illustrated with reference to FIG. 8. The insulating layer A was formed by sputtering using $SiO_2$ as a target and the insulating layer B was formed by plasma CVD using $SiH_4$ as a deposition gas.

First, a method for manufacturing samples is described. As the insulating layer A, a silicon oxide layer with a thickness of 200 nm was formed over a silicon substrate by RF sputtering under the following conditions: $SiO_2$ was used as a target; argon and oxygen were supplied at flow rates of 40 sccm and 10 sccm, respectively; and the power and the pressure were adjusted to 1.5 kW and 0.4 Pa, respectively. At that time, the substrate temperature was 100° C., and the distance between electrodes in a sputtering apparatus was 60 mm.

As the insulating layer B, a silicon oxynitride layer with a thickness of 100 nm was formed over a silicon substrate by plasma CVD in which plasma discharge was performed under the following conditions: $SiH_4$ as a deposigion gas and $N_2O$ as an oxynitride gas were supplied with flow rates of 4 sccm and 800 sccm, respectively to gain stability; the pressure in the treatment chamber was 40 Pa; RF power source frequency was 27 MHz; and the power of the RF power source was 50 W. At that time, the substrate temperature was 400° C., and the distance between electrodes in a plasma CVD apparatus was 15 mm.

Figure 8:
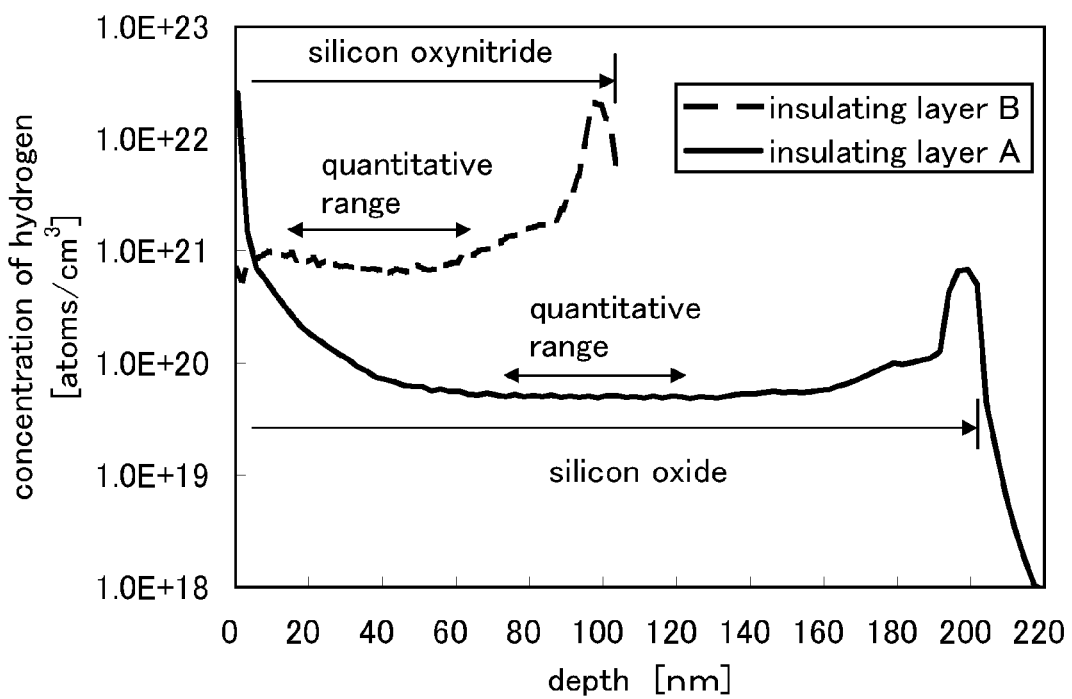
FIG. 8 is a graph showing the concentration of hydrogen contained in an insulating layer.

Next, SIMS measurement results of the insulating layers A and B are shown in FIG. 8. In FIG. 8, the vertical axis represents the concentration of hydrogen in the insulating layers A and B, and the horizontal axis represents the depth in a direction of the substrate from the surfaces of the insulating layers A and B. Further, the solid line shows a concentration profile of the insulating layer A and the broken line shows a concentration profile of the insulating layer B. In the insulating layer A, the horizontal axis corresponding to 70 nm to 120 nm represents a quantitative range and the horizontal axis corresponding to 200 nm or more represents the silicon substrate. In the insulating layer B, the horizontal axis corresponding to 10 nm to 60 nm represents a quantitative range and the horizontal axis corresponding to 100 nm or more represents the silicon substrate. Note that the quantitative range in this example means a range where high reliability is obtained with the SIMS measurement results (concentration of hydrogen). In other words, the measurement results (concentration of hydrogen) in each quantitative range in insulating layers A and B represent the concentration of hydrogen included in each of the insulating layers A and B.

When the quantitative ranges of the insulating layer A and the insulating layer B were compared in FIG. 8, the concentration of hydrogen in the insulating layer A was greater than or equal to $4.9 \times 10^{19}$ atoms/cm$^3$ and less than or equal to $5.2 \times 10^{19}$ atoms/cm$^3$, while the concentration of hydrogen in the insulating layer B was greater than or equal to $6.4 \times 10^{20}$ atoms/cm$^3$ and less than or equal to $9.6 \times 10^{20}$ atoms/cm$^3$.

It was found that the silicon oxide layer in which diffusion of hydrogen was suppressed was formed because the insulating layer A was formed by sputtering using $SiO_2$ as the target while being supplied with argon and oxygen. Also, it was found that hydrogen was diffused in the silicon oxynitride layer because the insulating layer B was formed using $SiH_4$ as the deposition gas.

Example 2

In this example, in the top-gate/top-contact transistors described in Embodiment 1, electric characteristics of the following transistors (sample A and sample B) illustrated in Example 1 is described. The transistor (sample A) was formed using silicon oxide of the insulating layer A described in Example 1, and the transistor (sample B) was formed using silicon oxynitride of the insulating layer B described in Example 1. The other structures of the transistors are the same in the sample A and the sample B.

Manufacturing steps of the sample A and sample B are illustrated with reference to FIGS. 2A to 2D. A glass substrate (EAGLE XG-2000 manufactured by Corning Incorporated) was used as the substrate 102.

As shown in FIG. 2A, the insulating layer 104 was formed over the substrate 102.

The insulating layer 104 in each of the samples A and B was formed to have a thickness of 200 nm and formed by the method described in Example 1.

Then, the conductive film serving as the source electrode layer 106a and the drain electrode layer 106b were formed. A titanium film with a thickness of 150 nm was formed by DC sputtering as follows: a titanium target was used; argon with a flow rate of 20 sccm was supplied; and the power and the pressure were adjusted to 12 kW and 0.1 Pa, respectively. At that time, the substrate temperature was room temperature (15° C. to 35° C.), and the distance between electrodes in a sputtering apparatus was 400 mm.

After a resist was applied over the titanium film, light exposure was performed using a first photomask. After that, development was performed, so that a resist mask was formed. Then, etching was performed using the resist mask, whereby the source electrode layer 106a and the drain electrode layer 106b were formed. Here, an inductively coupled plasma (ICP) etching apparatus was used. A first etching was performed in the following conditions: ICP power was 450 W, the bias power was 100 W, the pressure was 1.9 Pa, and boron trichloride at a flow rate of 60 sccm and chlorine at a flow rate of 20 sccm were used for an etching gas. After that, the resist mask was removed.

Then, the oxide semiconductor film was formed with a thickness of 50 nm over the insulating layer 104, the source electrode layer 106a, and the drain electrode layer 106b. Here, the oxide semiconductor film containing indium (In), gallium (Ga), zinc (Zn), and oxygen atoms was formed by DC sputtering without heating the substrate. Note that the DC sputtering was performed under the following condition: the target composition in the oxide semiconductor was $In_2O_3$:$Ga_2O_3$:$ZnO$=1:1:1 (In:Ga:Zn=1:1:0.5); argon with a flow rate of 30 sccm and oxygen with a flow rate of 15 sccm were supplied; and the power and the pressure were adjusted to 0.5 kW and 0.4 Pa, respectively.

After a resist was applied over the oxide semiconductor film, light exposure was performed using a second photomask. After that, development was performed, so that a resist mask was formed. Then, etching was performed using the resist mask, whereby the island-shaped oxide semiconductor layer 107 was formed. Here, wet etching was performed using an Al-Etchant (an aqueous solution containing 2.0 wt % nitric acid, 9.8 wt % acetic acid, and 72.3 wt % phosphoric acid) produced by Wako Pure Chemical Industries Co., Ltd. After that, the resist mask was removed. The structure obtained through the steps up to here is illustrated in FIG. 2B.

Then, heat treatment was performed at 350° C. for 60 minutes in the atmosphere, whereby the island-shaped oxide semiconductor layer 108 was obtained. The gate insulating layer 110 was formed over the island-shaped oxide semiconductor layer 108. As the gate insulating layer 110, a silicon oxide layer with a thickness of 200 nm was formed by RF sputtering under the following conditions: $SiO_2$ was used as a target; argon with a flow rate of 25 sccm and oxygen with a flow rate of 25 sccm were supplied; and the power and the pressure were adjusted to 1.5 kW and 0.4 Pa, respectively. At that time, the substrate temperature was 100° C., and the distance between electrodes in the sputtering apparatus was 60 mm. The structure obtained through the steps up to here is illustrated in FIG. 2C.

Then, a conductive film serving as the gate electrode layer 112 was formed after performing heat treatment at 350° C. for 60 minutes in the atmosphere. Here, a titanium film with a thickness of 150 nm was formed by DC sputtering as follows: a titanium target was used; argon with a flow rate of 20 sccm was supplied; and the power and the pressure were adjusted to 12 kW and 0.1 Pa, respectively. At that time, the substrate temperature was room temperature (15° C. to 35° C.), and the distance between electrodes in the sputtering apparatus was 400 mm.

After a resist was applied over the titanium film, light exposure was performed using a third photomask. After that, development was performed, so that a resist mask was formed. Then, etching was performed using the resist mask, whereby the gate electrode layer 112 was formed. Here, an ICP apparatus was used and the first etching was performed in the following conditions: ICP power was 450 W, the bias power was 100 W, the pressure was 1.9 Pa, and an etching gas included boron trichloride at a flow rate of 60 sccm and chlorine at a flow rate of 20 sccm. After that, the resist mask was removed. Through the above steps, the transistor was manufactured (see FIG. 2D).

Figure 9:
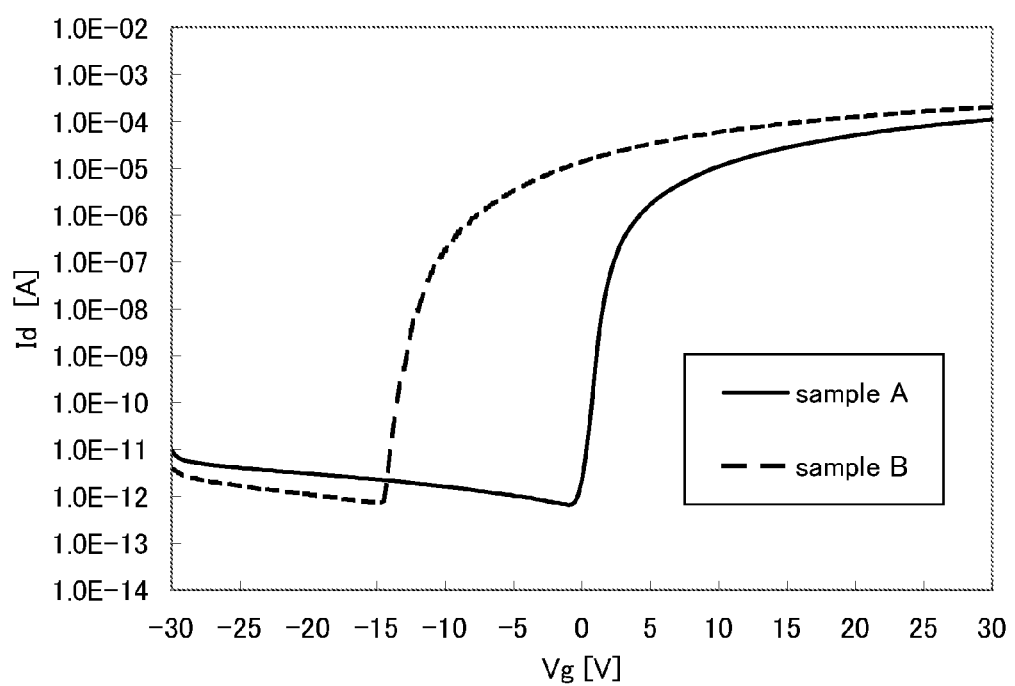
FIG. 9 is a graph showing a measurement result of electric characteristics of a transistor.

The measurement result of the samples A and B is shown in FIG. 9. The solid line shows current-voltage characteristics and field-effect mobility of the sample A when the drain voltage was 10 V, and the broken line shows current-voltage characteristics and field-effect mobility of the sample B when the drain voltage was 10 V. Note that the transistor of this example was formed so as to have a channel length of 3.0 μm and a channel width of 10 μm.

FIG. 9 shows that favorable electric characteristics were obtained in the sample A in which the concentration of hydrogen in the insulating layer was less than $6 \times 10^{20}$ atoms/cm$^3$, while electric characteristics were degraded in the sample B in which the concentration of hydrogen in the insulating layer was greater than or equal to $6 \times 10^{20}$ atoms/cm$^3$ because threshold voltage shifted in the negative direction, and a drain current flowed in a state (Vg=0V) where voltage was not applied to the gate electrode.

From the above, it can be seen that the defect was caused in the sample B in which the concentration of hydrogen in the insulating layer was greater than or equal to $6 \times 10^{20}$ atoms/cm$^3$ because hydrogen was diffused into the oxide semiconductor layer including the channel region in the manufacturing steps of the transistor.

From the above, it can be seen that the sample A in which the concentration of hydrogen in the insulating layer was less than $6 \times 10^{20}$ atoms/cm$^3$ had favorable electric characteristics because diffusion of hydrogen in the oxide semiconductor layer including the channel region was prevented in the manufacturing steps of the transistor.

Consequently, the transistor having favorable electric characteristics can be provided by setting the concentration of hydrogen in the insulating layer to less than $6 \times 10^{20}$ atoms/cm$^3$.

This application is based on Japanese Patent Application serial no. 2010-117086 filed with Japan Patent Office on May 21, 2010, the entire contents of which are hereby incorporated by reference.

EXPLANATION OF REFERENCE

100: transistor, 102: substrate, 104: insulating layer, 106a: source electrode layer, 106b: drain electrode layer, 107: oxide semiconductor layer, 108: oxide semiconductor layer, 110: gate insulating layer, 112: gate electrode layer, 200: transistor, 206a: source electrode layer, 206b: drain electrode layer, 207: oxide semiconductor layer, 208: oxide semiconductor layer, 210: gate insulating layer, 212: gate electrode layer, 2700: e-book reader, 2701: housing, 2703: housing, 2705: display portion, 2706: photoelectric conversion device, 2707: display portion, 2708: photoelectric conversion device, 2711: hinge, 2721: power switch, 2723: operation key, 2725: speaker, 9301: top housing, 9302: bottom housing, 9303: display portion, 9304: keyboard, 9305: external connection port, 9306: pointing device, 9307: display portion, 9600: television set, 9601: housing, 9603: display portion, 9605: stand, 9607: display portion, 9609: operation key, 9610: remote controller, 9700: digital photo frame, 9701: housing, 9703: display portion

The invention claimed is:

1. A semiconductor device comprising:
    an insulating layer including a first region;
    a source electrode layer over the insulating layer;
    a drain electrode layer over the insulating layer;
    an oxide semiconductor layer over the source electrode layer and the drain electrode layer, the oxide semiconductor layer including a second region and a third region; and
    a gate insulating layer over the oxide semiconductor layer, the gate insulating layer including a fourth region;
    wherein:
    the first region is in contact with the second region;
    the third region is in contact with the fourth region; and
    a concentration of hydrogen in a part of the insulating layer is greater than zero and less than $6 \times 10^{20}$ atoms/cm$^3$.

2. The semiconductor device according to claim 1, wherein the insulating layer and the gate insulating layer are oxide insulating layers.

3. The semiconductor device according to claim 2, wherein the oxide insulating layers are silicon oxide, silicon oxynitride, silicon nitride oxide, hafnium oxide, aluminum oxide, or tantalum oxide.

4. The semiconductor device according to claim 1, further comprising a gate electrode layer over the gate insulating layer, wherein the gate electrode layer overlaps with the oxide semiconductor layer with the gate insulating layer interposed therebetween, and the gate electrode layer is provided between the source electrode layer and the drain electrode layer.

5. The semiconductor device according to claim 1, wherein a concentration of hydrogen in a part of the gate insulating layer is less than $6 \times 10^{20}$ atoms/cm$^3$.

6. The semiconductor device according to claim 1, wherein the concentration of hydrogen in the part of the insulating layer is less than or equal to $5 \times 10^{19}$ atoms/cm$^3$.

7. The semiconductor device according to claim 6, wherein a concentration of hydrogen in a part of the gate insulating layer is less than or equal to $5 \times 10^{19}$ atoms/cm$^3$.

8. A semiconductor device comprising:
an insulating layer including a first region;
an oxide semiconductor layer over the insulating layer, the oxide semiconductor layer including a second region and a third region;
a source electrode layer electrically connected to the oxide semiconductor layer;
a drain electrode layer electrically connected to the oxide semiconductor layer; and
a gate insulating layer over the source electrode layer and the drain electrode layer, the gate insulating layer including a fourth region,
wherein:
the first region is in contact with the second region;
the third region is in contact with the fourth region; and
a concentration of hydrogen in a part of the insulating layer is greater than zero and less than $6 \times 10^{20}$ atoms/cm$^3$.

9. The semiconductor device according to claim 8, wherein the insulating layer and the gate insulating layer are oxide insulating layers.

10. The semiconductor device according to claim 9, wherein the oxide insulating layers are silicon oxide, silicon oxynitride, silicon nitride oxide, hafnium oxide, aluminum oxide, or tantalum oxide.

11. The semiconductor device according to claim 8, further comprising a gate electrode layer over the gate insulating layer, wherein the gate electrode layer overlaps with the oxide semiconductor layer with the gate insulating layer interposed therebetween, and the gate electrode layer is provided between the source electrode layer and the drain electrode layer.

12. The semiconductor device according to claim 8, wherein a concentration of hydrogen in a part of the gate insulating layer is less than $6 \times 10^{20}$ atoms/cm$^3$.

13. The semiconductor device according to claim 8, wherein the concentration of hydrogen in the part of the insulating layer is less than or equal to $5 \times 10^{19}$ atoms/cm$^3$.

14. The semiconductor device according to claim 13, wherein a concentration of hydrogen in a part of the gate insulating layer is less than or equal to $5 \times 10^{19}$ atoms/cm$^3$.

15. A method for manufacturing a semiconductor device comprising the steps of:
forming an insulating layer by plasma CVD using $SiF_4$ as a deposition gas;
forming a source electrode layer and a drain electrode layer over the insulating layer;
forming an oxide semiconductor layer over the insulating layer; and
forming a gate insulating layer over the source electrode layer, the drain electrode layer and the oxide semiconductor layer,
wherein the source electrode layer is in contact with the oxide semiconductor layer,
wherein the drain electrode layer is in contact with the oxide semiconductor layer,
wherein the gate insulating layer is over the source electrode layer and the drain electrode layer, and the gate insulating layer is in contact with the oxide semiconductor layer, and
wherein a concentration of hydrogen in a part of the insulating layer is greater than zero and less than $6 \times 10^{20}$ atoms/cm$^3$.

16. The method for manufacturing a semiconductor device according to claim 15, wherein the insulating layer and the gate insulating layer are oxide insulating layers.

17. The method for manufacturing a semiconductor device according to claim 16, wherein the oxide insulating layers comprise at least one of silicon oxide, silicon oxynitride, silicon nitride oxide, hafnium oxide, aluminum oxide, or tantalum oxide.

18. The method for manufacturing a semiconductor device according to claim 15, further comprising the step of forming a gate electrode layer over the gate insulating layer,
wherein the gate electrode layer overlaps with the oxide semiconductor layer with the gate insulating layer interposed therebetween, and the gate electrode layer is provided between the source electrode layer and the drain electrode layer.

19. The method for manufacturing a semiconductor device according to claim 15, wherein a concentration of hydrogen in a part of the gate insulating layer is less than $6 \times 10^{20}$ atoms/cm$^3$.

20. The method for manufacturing a semiconductor device according to claim 15, wherein the concentration of hydrogen in the part of the insulating layer is less than or equal to $5 \times 10^{19}$ atoms/cm$^3$.

21. The method for manufacturing a semiconductor device according to claim 20, wherein a concentration of hydrogen in a part of the gate insulating layer is less than or equal to $5 \times 10^{19}$ atoms/cm$^3$.

22. The method for manufacturing a semiconductor device according to claim 15, wherein the insulating layer is formed by plasma CVD using an oxidizing gas of $N_2O$ or $O_2$.

23. The method for manufacturing a semiconductor device according to claim 22, wherein the insulating layer is formed by plasma CVD using an argon gas.

* * * * *